US008590956B2

(12) United States Patent  (10) Patent No.: US 8,590,956 B2
Coady  (45) Date of Patent: Nov. 26, 2013

(54) SUBSTRATE HANDLING SYSTEM FOR ALIGNING AND ORIENTING SUBSTRATES DURING A TRANSFER OPERATION

(75) Inventor: Matthew W. Coady, Hollis, NH (US)

(73) Assignee: Brooks Automation, Inc., Chelmsford, MA (US)

( * ) Notice: Subject to any disclaimer, the term of this patent is extended or adjusted under 35 U.S.C. 154(b) by 144 days.

(21) Appl. No.: 13/230,280

(22) Filed: Sep. 12, 2011

(65) Prior Publication Data

US 2012/0089251 A1  Apr. 12, 2012

Related U.S. Application Data

(63) Continuation of application No. 11/045,545, filed on Jan. 28, 2005, now Pat. No. 8,016,541, and a continuation of application No. PCT/US03/28391, filed on Sep. 10, 2003.

(51) Int. Cl.
*H01L 21/687* (2006.01)
(52) U.S. Cl.
USPC .............................. 294/213; 414/941; 901/40
(58) Field of Classification Search
USPC ........... 414/744.5, 941; 901/40; 294/185, 213
See application file for complete search history.

(56) References Cited

U.S. PATENT DOCUMENTS

| 4,787,813 | A |   | 11/1988 | Stevens et al. |
| 5,102,291 | A |   | 4/1992 | Hine |
| 5,239,892 | A |   | 8/1993 | Sakai |
| 5,408,153 | A | * | 4/1995 | Imai et al. ................... 310/68 B |
| 5,445,486 | A |   | 8/1995 | Kitayama et al. |
| 6,002,840 | A |   | 12/1999 | Hofmeister |
| 6,054,786 | A | * | 4/2000 | Springer ................. 310/40 MM |
| 6,256,555 | B1 |   | 7/2001 | Bacchi et al. |
| 6,275,748 | B1 |   | 8/2001 | Bacchi et al. |
| 6,360,144 | B1 |   | 3/2002 | Bacchi et al. |
| 6,438,460 | B1 |   | 8/2002 | Bacchi et al. |
| 6,453,214 | B1 |   | 9/2002 | Bacchi et al. |
| 6,618,645 | B2 |   | 9/2003 | Bacchi et al. |
| 6,700,278 | B1 |   | 3/2004 | Ehrfeld et al. |

(Continued)

FOREIGN PATENT DOCUMENTS

WO  99/57752  11/1999

OTHER PUBLICATIONS

"Using Emulation to Validate a Cluster Tool Simulation Model", Lebaron et al., Proceedings of the 2002 Winter Simulation Conference, 6 pages.

*Primary Examiner* — Scott Lowe
(74) *Attorney, Agent, or Firm* — Perman & Green, LLP; Colin C. Durham

(57) ABSTRACT

A system for sensing, orienting, and transporting wafers in an automated wafer handling process that reduces the generation of particles and contamination so that the wafer yield is increased. The system includes a robotic arm for moving a wafer from one station to a destination station, and an end-effector connected to an end of the robotic arm for receiving the wafer. The end-effector includes a mechanism for gripping the wafer, a direct drive motor for rotating the wafer gripping mechanism, and at least one sensor for sensing the location and orientation of the wafer. A control processor calculates the location of the center and the notch of the wafer based on measurements by the sensor(s) and generates an alignment signal for rotating the wafer gripping mechanism so that the wafer is oriented at a predetermined position on the end-effector while the robotic arm is moving to another station.

23 Claims, 10 Drawing Sheets

(56) References Cited

U.S. PATENT DOCUMENTS

| | | |
|---|---|---|
| 6,787,965 B1 | 9/2004 | Horng et al. |
| 6,798,092 B1 | 9/2004 | Gabrys et al. |
| 6,813,513 B2 | 11/2004 | Goto |
| 6,813,543 B2 | 11/2004 | Aalund et al. |
| 2002/0031077 A1* | 3/2002 | Shiwa .......................... 369/271 |
| 2002/0097530 A1* | 7/2002 | Bonin et al. ................ 360/294.5 |
| 2002/0192056 A1 | 12/2002 | Reimer et al. |
| 2004/0037691 A1 | 2/2004 | Woodruff et al. |

* cited by examiner

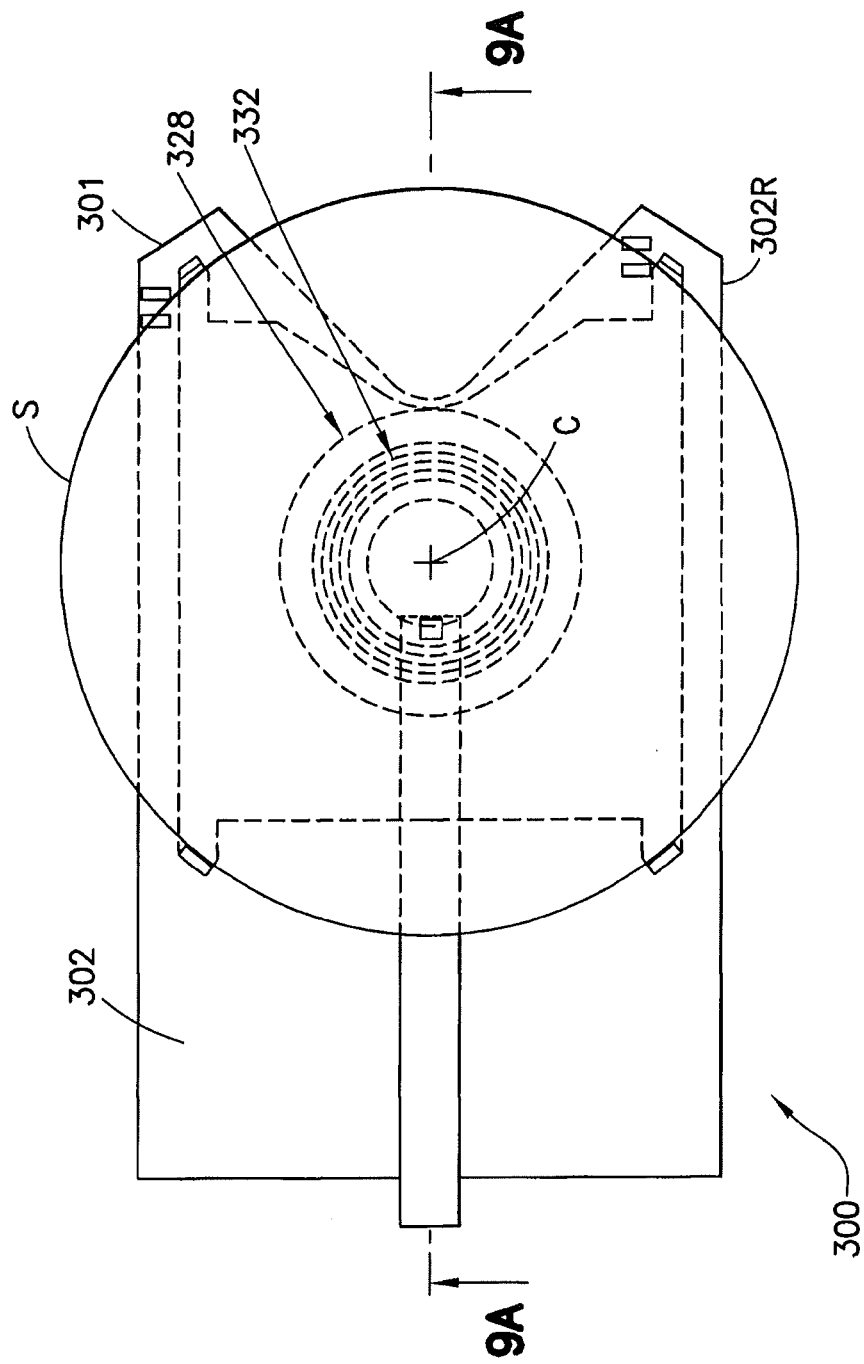

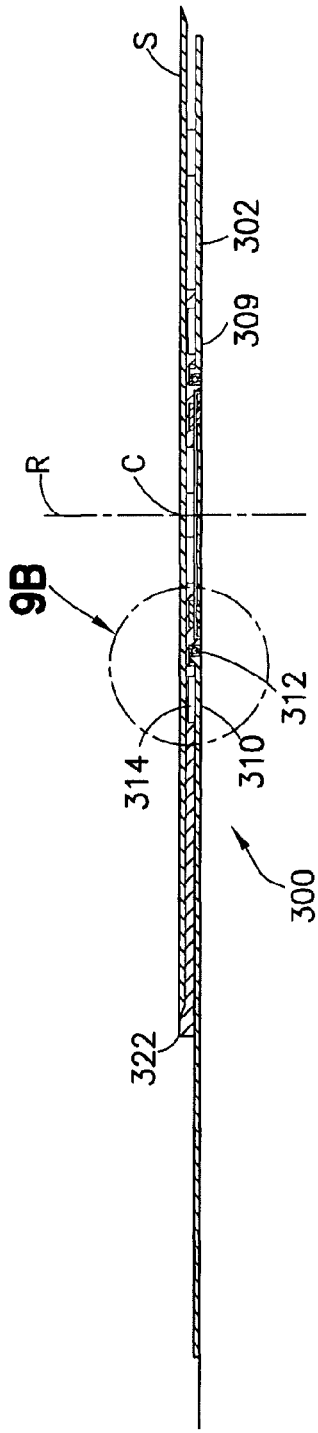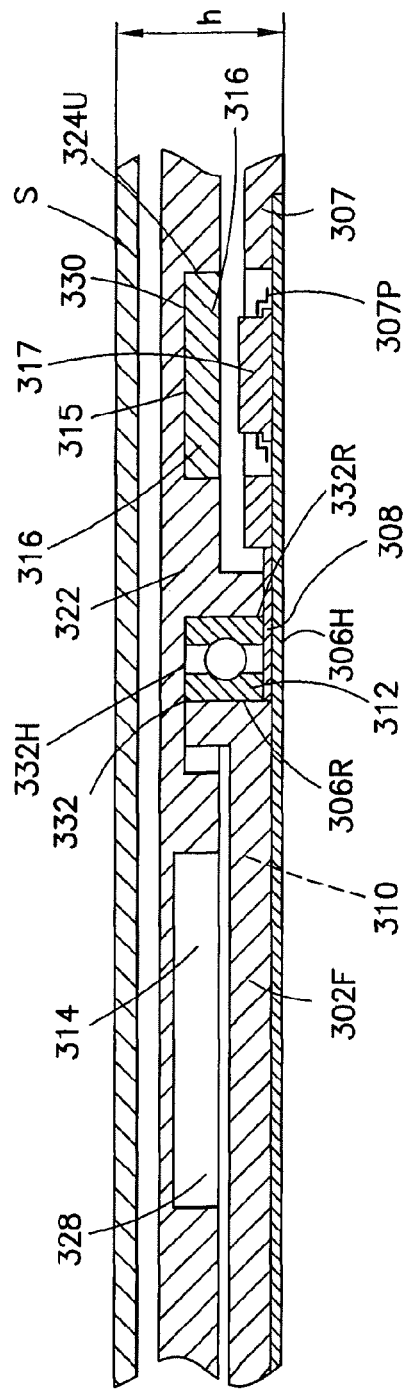
FIG.9A
FIG.9B

SUBSTRATE HANDLING SYSTEM FOR ALIGNING AND ORIENTING SUBSTRATES DURING A TRANSFER OPERATION

This application is a continuation of and claims the benefit of U.S. patent application Ser. No. 11/045,545 filed on Jan. 28, 2005, which is a continuation of International Patent Application No. US03/28391, filed Sep. 10, 2003, the disclosures of which are incorporated by reference herein in their entireties.

BACKGROUND OF THE INVENTION

1. Field of the Invention

The exemplary embodiments of the present invention relate to a substrate transport system and, more particularly, to a substrate transport system capable of orienting and aligning a substrate "on the fly".

2. Brief Description of Earlier Related Developments

In semiconductor fabrication processes, wafers are transferred between stations, such as storage, queuing, processing and other work stations. In typical automated wafer handling processes, a wafer is first picked up by a robotic arm for transfer from one station to another station. Next, the wafer is placed on an aligner for aligning and centering the wafer to a desired position using a notch or flat located on the wafer's edge. Once properly aligned, the wafer is then placed in the desired station for processing. After the processing is completed at the desired station, the wafer may then be picked up and placed again at another station.

Each time that the wafer is picked up, placed, and aligned, contact is made with either the edge or the back side of the wafer and particles are generated. For instance, in a single wafer process cycle, the wafer may be contacted as many as twelve times when using a three-axis aligner or at least eight times when a single axis aligner is used.

In addition, the alignment process requires a dedicated aligning device and a separate step in the wafer process cycle. The dedicated aligning device often creates a bottleneck that limits the wafer throughput in the system and also introduces additional handling that generates particles. Adding aligners to the system may help to slightly increase this throughput problem but creates an undesirable increase in the cost, complexity and generation of particles to the wafer handling system. Accordingly, a system is desired for enhancing the wafer handling process by reducing the generation of particles and wafer damage so that the wafer yield is increased. Also, it is desired to increase the wafer throughput by performing the alignment process in parallel with moving the wafer.

In order to effect alignment/reorienting of the wafer (or any other flat panel substrate/workpiece) in parallel with moving the wafer so called "on the fly" alignment, the handling systems are generally provided with means or drives for performing such alignment. In conventional handling system, the "on the fly" alignment drives have generally been used by systems that do not employ "edge gripping" for holding the substrate. These non-edge gripping systems, however, are generally falling into disfavor with users (for edge-gripping systems) because the non-edge gripping systems contact the wafer surface with the associated potential for contamination. In the case of edge gripping systems, attempts have been made to provide an "on the fly" alignment drive. These conventional attempts take the form of a servomotor mounted away from the wafer and the chuck holding the wafer on the handling system. This is known as "off axis" mounting. The servomotor is connected to the chuck by a suitable transmission that imparts motion from the servomotor to the chuck. In conventional systems, locating the motor away from the substrate minimizes potential for particulate contaminants generated during motor operation coming in contact with the wafer surfaces. Nevertheless, by employing a transmission to connect the motor to the chuck, such as cables, conventional systems still have the potential for having particles contaminate the surface of the wafers being handled. Further, the transmission, by its very nature as a further drive element between motor and chuck, increases the possibility for inaccuracy in placement/aligning of the substrate. The transmission further increases the weight and complexity of the end effector with a detrimental impact to the control of the handling system. Further, due to the very tight height constraints, the chuck, of the end effector is inserted between stacked wafers in a pod/cassette with a pitch of about 10.0 mm and a wafer thickness of about 0.77 mm, the transmission design is complex. Correspondingly, the transmission may be unreliable and time consuming to install. The present invention as evident from the exemplary embodiments overcomes the problems of conventional handling systems as will be described in greater detail below.

SUMMARY OF THE EXEMPLARY EMBODIMENTS

The present invention is directed to a system for locating and orienting substrates, such as semiconductor wafers, during the pick up and transfer steps in an automated substrate handling process. In a semiconductor fabrication process, the system is able to reduce the generation of particles from and the contamination of semiconductor wafers. As a result, the wafer yield and throughput of the fabrication process are increased.

More particularly, the system includes a robotic arm for moving a wafer from one station to another station. An end-effector is connected to an end of the robotic arm for handling the wafer. The end-effector may include a mechanism for gripping the wafer, a mechanism, such as a motor, for moving the wafer gripping mechanism, and at least one sensory system for sensing the location and orientation of the wafer. A control processor operatively connected to the robotic arm and the end-effector calculates the location of the center and a notch or flat of the wafer based on data from the at least one sensory system. The control processor generates a signal to move the wafer gripping mechanism so that the wafer is centered on the end-effector when picked by the end-effector and is oriented at a predetermined position on the end-effector while the robotic arm is moving to another station. After the wafer is picked up by the end-effector, the control processor can refine the calculation of the center of the wafer and adjust the wafer's orientation before being dropped off at the next station.

Other aspects, features and advantages of the present invention are disclosed in the detailed description of the exemplary embodiments that follows.

DESCRIPTION OF THE DRAWINGS

The exemplary embodiments will be more fully understood by reference to the following detailed description of the invention in conjunction with the drawings, of which:

FIG. 9 is a plan view of the end-effector in FIG. 8 and a substrate S;

FIG. 9A is a cross-section view of the end-effector and substrate S taken along view line A-A in FIG. 9;

FIG. 9B is an enlarged partial cross-section view of the end effector and substrate S in FIG. 9B;

DETAILED DESCRIPTION OF THE EXEMPLARY EMBODIMENTS

A substrate handling system according to the present invention provides a robotic arm configured to handle substrates, such as semiconductor wafers, reticles, etc. The system is operative to sense the substrate and center the substrate with respect to the robotic arm's end-effector prior to picking up the substrate. The system is also operative to orient the substrate in a desired orientation and to calculate the center of the wafer during transfer of the substrate to a destination station. The system is particularly useful in transferring semiconductor wafers between stations in a semiconductor fabrication process. The system reduces the amount of wafer handling necessary between stations so that the generation of particles from and contamination of the wafers decreases, increasing wafer yield. The system eliminates a separate alignment step, thereby increasing wafer throughput.

Figure 1:
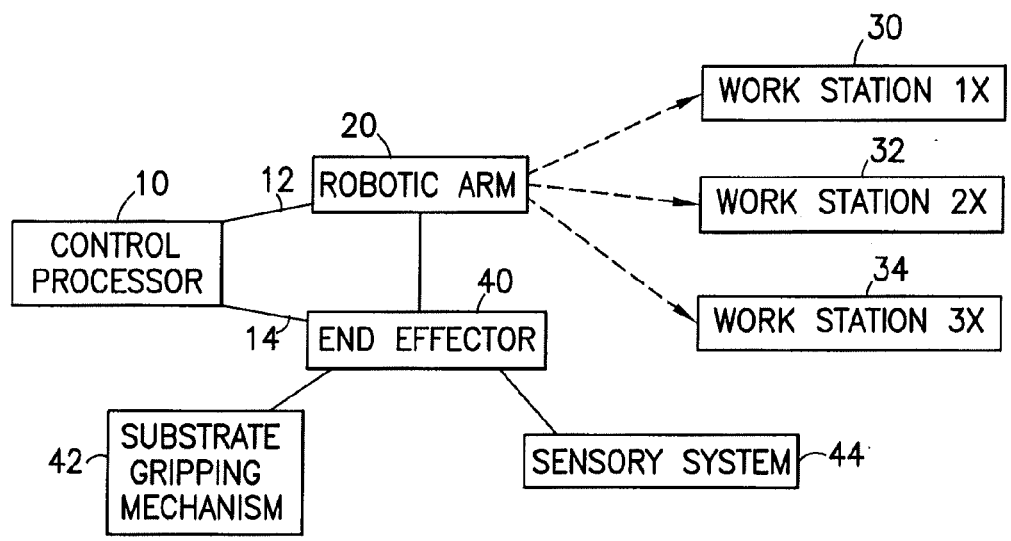
FIG. 1 illustrates a block diagram of a wafer handling system according to an embodiment of the present invention.

Referring to FIG. 1, the system includes one or more robotic arm assemblies 20 operatively communicative with a control processor 10 by, for example, a bus, cable or wireless connection 12. Each of the robotic arm assemblies 20 includes an end-effector 40 operatively communicative with the control processor 10 by a bus, cable or wireless connection 14, which will be described in more detail below, and is associated with one or more stations 30, 32 and 34 for moving substrates, such as wafers, therebetween. The end-effector 40 includes a substrate gripper or mechanism 42 and a sensory system 44. The control processor 10 calculates the location of the center and an alignment feature, such as a notch or flat of the wafer, based on data from sensors on the end-effector and generates centering, aligning, and orienting signals for the end-effector based on these calculations. The control processor 10 computes and communicates to the robotic arm assemblies 20 the actual substrate center position, and the arm assembly positions the end-effector 40 centered relative to the substrate before gripping the substrate.

After the end-effector 40 grips the centered wafer, the control processor 10 generates additional signals for rotating the wafer and processing the sensor signals in order to finally re-compute the wafer center, find the notch or flat position and rotate the notch or flat in a desired position. The orientation, alignment and robotic arm trajectory correction are performed while the robotic arm moves the wafer from one station to another station. The control processor 10 may include distributed control architecture for performing the orientation, alignment and correction. The control processor 10 may also be mounted in close proximity to the end-effector 40 for independently controlling the alignment feature.

Figure 2:
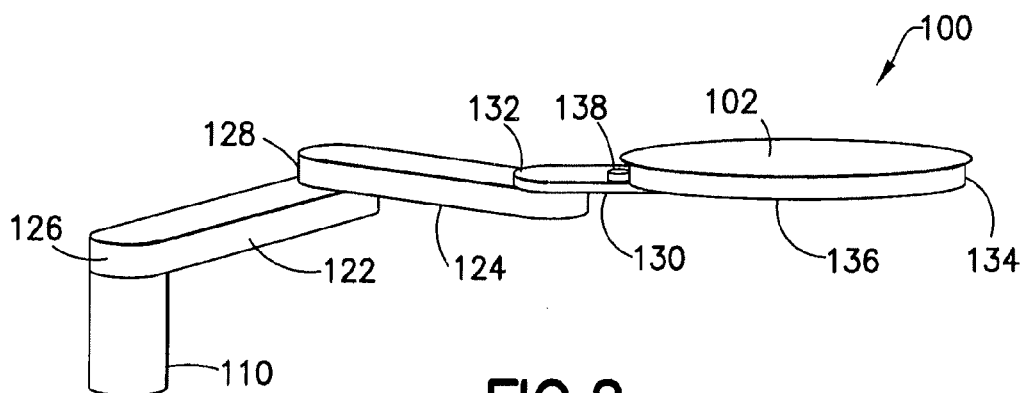
FIG. 2 illustrates a robotic arm and an end-effector used in a wafer handling system according to an embodiment of the present invention.

FIG. 2 schematically illustrates a typical robotic arm assembly 100 for moving a semiconductor wafer 102 from one station to another station in the semiconductor fabrication process. The arm assembly 100 includes an arm 120 mounted on a support 110, such as a central column that houses a lifting mechanism (not shown) to raise and lower the arm vertically. The arm 120 includes an inner arm 122, an outer arm 124, and the end-effector 130. The inner arm 122 is supported by the central column 110 at a rotatable "shoulder" joint 126 to effect rotation about a vertical axis through the central column 110. Similarly, the outer arm 124 is mounted to the inner arm 122 at a rotatable "elbow" joint 128 for rotation about a vertical axis, and the end-effector 130 is mounted to the outer arm 124 at a rotatable "wrist" joint 132 for rotation about a vertical axis. Rotation about the three rotatable joints 126, 128 and 132 allows the end-effector 130 to move to any coordinate position in a horizontal plane, while translation of the arm 120 on the central column provides vertical motion. It will be appreciated that the present invention can be used with other robotic arm configurations.

The end-effector 130 includes a wafer gripping mechanism 134, such as a vacuum wafer chuck, for gripping the wafer 102. It is appreciated that edge grippers and other known wafer handling mechanisms may also be used. A motor 136 or other suitable mechanism is provided for rotating the wafer gripping mechanism 134 when orientation is required. One or more sensors 138 are mounted at fixed and known locations on the end-effector 130 to sense the location and notch orientation of the wafer 102 with respect to the end-effector 130, described further below. Data collected by the sensors 138 is communicated to the control processor 10, which calculates the center of the wafer 102 and the location of its notch or flat before the wafer 102 is gripped by the wafer gripping mechanism 134. With the location data from the sensors 138, the known center of the end-effector 130 is positioned underneath the calculated center of the wafer 102, the end-effector 130 is raised until the wafer gripping mechanism 134 contacts the underside of the wafer 102, and the wafer gripping mechanism 134 is actuated to grip the wafer 102. Once the wafer 102 is gripped, the robotic arm assembly 100 moves the wafer 102 towards the next station. At the same time, the end-effector 130 aligns the wafer 102 by rotating the wafer gripping mechanism 134 to place-the notch or flat of the wafer 102 in its desired orientation prior to releasing the wafer 102 at the next station.

Figure 3:
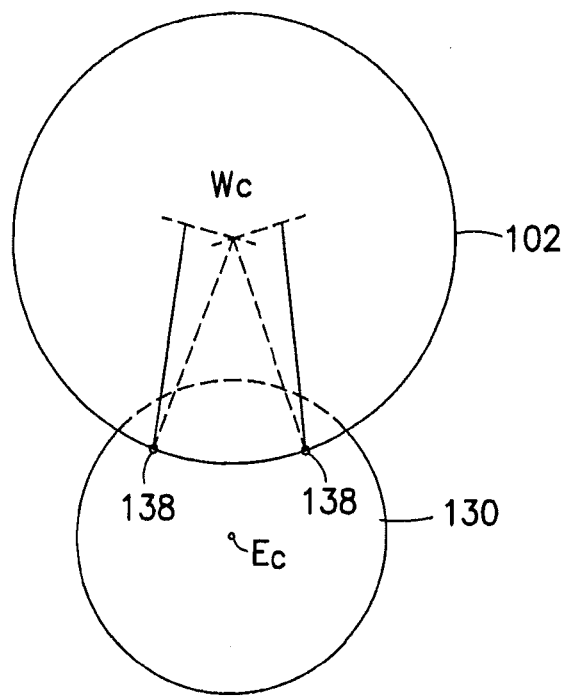
FIG. 3 illustrates exemplary wafer positioning measurements according to an embodiment of the present invention.

The control processor 10 is able to calculate the location of the wafer's center $W_c$ based on the sensor data. See FIG. 3. The diameter of the wafer 102 is known. Commonly in semiconductor fabrication, the wafers have a diameter of 300 mm. As noted above, the locations of the sensors 138 are fixed with respect to the end-effector 130 and are thus known by the control processor 10. Thus, the center of the wafer 102 can be determined by sensing at least two edge locations of the wafer 102, from which a chord length can be calculated. Note that, if the sensors 138 are located near the leading edge of the end-effector 130, that is, the edge of the end-effector 130 that first moves underneath the wafer 102, the control processor 10 can be instructed that the center of the wafer 102 is in front of the leading edge. Thus, two edge data points are sufficient to enable the calculation of the location of the center of the wafer 102 of known diameter. The control processor 10 is then able to move the end-effector 130 to a desired alignment with respect to the wafer 102, for example, with the wafer center $W_c$ over a center $E_c$ or other desired point of the end-effector 130.

Preferably, at least two sensors are placed at known locations on the end-effector to sense at least two wafer edge locations. It will be appreciated, however, that a single sensor on-the end-effector can be used if the sensor is suitably moved to sense two or more separate edge locations on a wafer. It will also be appreciated that a greater number of sensors can be used to provide a greater number of data points. If more than two data points are used, an average of the calculated center points can be determined.

Figure 4:
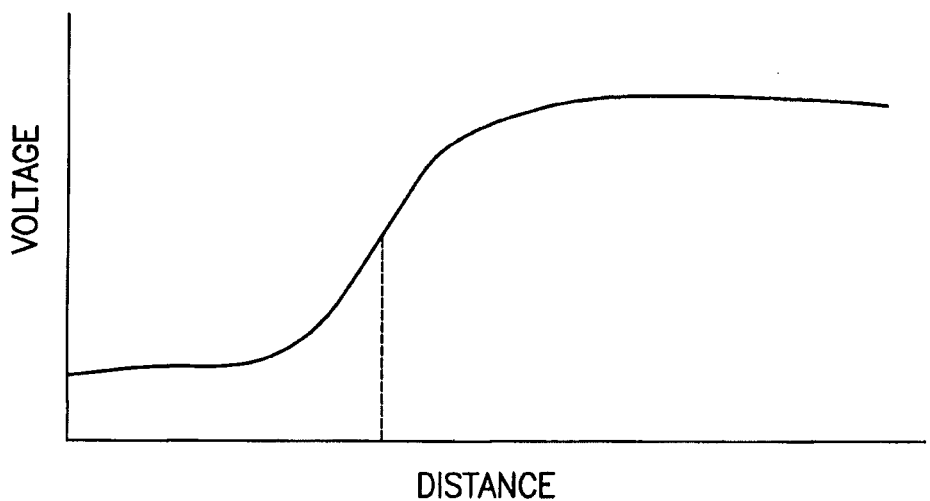
FIG. 4 illustrates an example of a voltage output curve from a capacitive sensor that may be used for sensing wafer edges.

The sensors 138 can be of any suitable type, such as capacitive, optical, acoustic, or ultrasonic sensors. As an example, if a capacitive sensor is used, the capacitance increases as the sensor moves underneath a wafer. For each sensor, a voltage output, which is proportional to impedance, is generated to select an appropriate edge point, indicated, as an example, by a vertical dashed line on FIG. 4. The actual edge point selected for use in the subsequent calculations is determined by a set of real time measurements and voltage/distance curves. The data processing algorithm can use look-up tables, statistical inference, or artificial intelligence, as would be known by one of skill in the art.

The detected capacitance is also dependent on the distance from the sensors to the bottom surface of the wafer. This distance can vary if the wafer is, for example, warped or tilted within the storage container. Thus, a sensor to detect this distance is preferably provided. This sensor is located to pass underneath the wafer in advance of the edge-detecting sensor. In this manner, the distance to the wafer can be provided, which enables a better determination of the edge to be made. For example, a calibration curve or look-up table can be provided for the appropriate distance from the wafer. Also, if the wafer is warped or tilted, the wafer may not be gripped correctly. Typically, if the wafer is not gripped correctly, the wafer gripping device ungrips and regrips or it aborts the grip and reports an error. Thus, the distance sensors can be used to determine if warping or a tilted wafer is present and to improve the robustness of the system.

Once the end-effector 130 is in alignment with the wafer 102, the end-effector 130 is raised vertically until it contacts the wafer 102. The wafer gripping mechanism 134 is engaged to grip the wafer 102. For example, if the wafer gripping mechanism 134 is a vacuum chuck, the chuck is actuated to draw the underside of the wafer 102 to the chuck. The robotic arm assembly 100 then begins the transfer of the wafer 102 to the next station. During this transfer, the wafer gripping mechanism 134 may be rotated until the notch or flat of the wafer 102 is detected by one of the sensors 138 located on the end-effector 130 for purposes of detecting the notch. Once the notch is detected, the wafer gripping mechanism 134 is rotated until the notch is located in the desired orientation for placement at the destination station.

Figure 5:
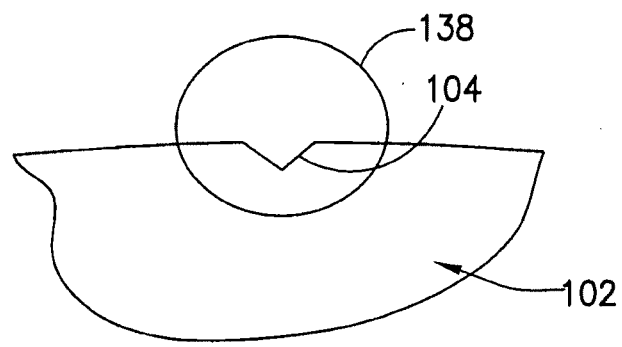
FIG. 5 illustrates a wafer notch measurement according to an embodiment of the present invention.

The notch may be detected in any suitable manner. For example, using a capacitive sensor, the capacitance decreases when the notch overlays the sensor, which may appear as a spike in a voltage/distance curve. As shown in FIG. 5, when the notch 104 is positioned over one of the capacitive sensors 138, the value measured by the sensor decreases, and when the notch 104 is not positioned over any of the sensors 138, the value measured by the sensor increases. In this example, a small sized sensor is preferred to increase the resolution of capacitive variance and enhance the accuracy in detecting the notch. Based on iterations of these calculations and comparisons, the position of the notch 104 on the wafer 102 may be determined. Once the notch 104 is detected, the wafer 102 may be oriented in the desired position. The control processor 10 may also make further adjustments to the orientation of the wafer 102 during the placing step when the end-effector 130 approaches the destination station. For example, knowing the location of the center of the wafer 102 with respect to the end-effector 130, the control processor 10 can move the end-effector 130 as necessary to deposit the wafer 102 in a desired position at the destination station.

The system may also include a teach process for improving the true location of the stations when the system is initially configured and whenever a system component is changed, such as an aligner, POD door or stage, for instance. In the teach process, the sensors 138 are first moved under or over a datum plate or a locating feature (there may be multiple locating features) positioned at known coordinates within the system. The data from the sensors 138 are used to provide feedback on whether the robotic arm assembly 100, is level and its absolute position in the global coordinate system. The robotic arm assembly 100 is adjusted if the data suggests that it is not level.

Next, the robotic arm assembly 100 moves to each work station 30, 32, and 34. As the leading edge of the substrate is detected, the center of the substrate is calculated. This information is used as the new station location. Additionally, information is provided on whether the station is level by measuring the apparent distance from the substrate as the sensors move under or over the substrate. With this information, a user may manually adjust and level the station. These steps are repeated for all of the work stations. This information may be also used to measure system changes and to predict failures. This teach process may be performed to improve the true locations of a full end-aligner or end-effectors with sensors.

Figure 6:
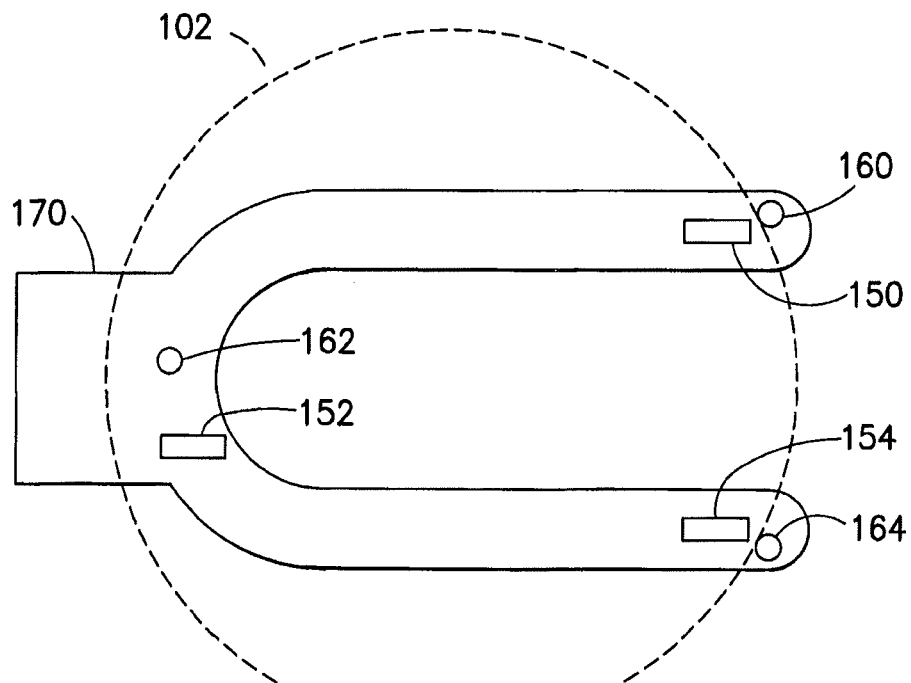
FIG. 6 illustrates a sensor configuration on an end-effector according to an embodiment of the present invention.

FIG. 6 illustrates an embodiment of the present invention in which six sensors 150, 152, 154, 160, 162 and 164 are placed at predetermined locations around the periphery of an end-effector base 170. In this embodiment, three rectangular sensors 150, 152 and 154 are used for sensing the edge of the wafer 102 and three circular sensors 160, 162 and 164 are used for sensing the notch and the distance of the wafer 102 from the end-effector base 170. The sensors 150, 152, 154, 160, 162 and 164 may be capacitive, acoustic, optical, reflective or other types of known sensors. This configuration of sensors allows the robotic arm to pick up the wafer and to grip the wafer without having the wafer slip along the surface of the wafer gripping mechanism or during placement in the station. The motion of the end-effector base 170 as it passes under the wafer 102 is used to detect the presence of the front and rear positions of the wafer 102. These measurements in combination with the geometry of the wafer (the diameter of the wafer) are used to determine the wafer's center and to adjust the pickup position in conjunction with geometric distance calculation algorithms. These measurements may also be used for controlling edge grippers to eliminate sliding or in cases where orientation of the notch is not required.

Although six sensors are used in the embodiment of FIG. 6, additional sensors and types of sensors may be used to increase the accuracy for calculating the center and compensating for errors such as a warped wafer, notches passing under the sensors and differences in substrate sizes. Generally, a straight motion by the end-effector under the wafer is used for pick up. However, other non-linear motions may be used to gather additional data points based on the number of sensors, and the size and-shape of the substrate in conjunction with the motion. Such alternative motions may reduce the number of necessary sensors to as little as one sensor.

Figure 7:
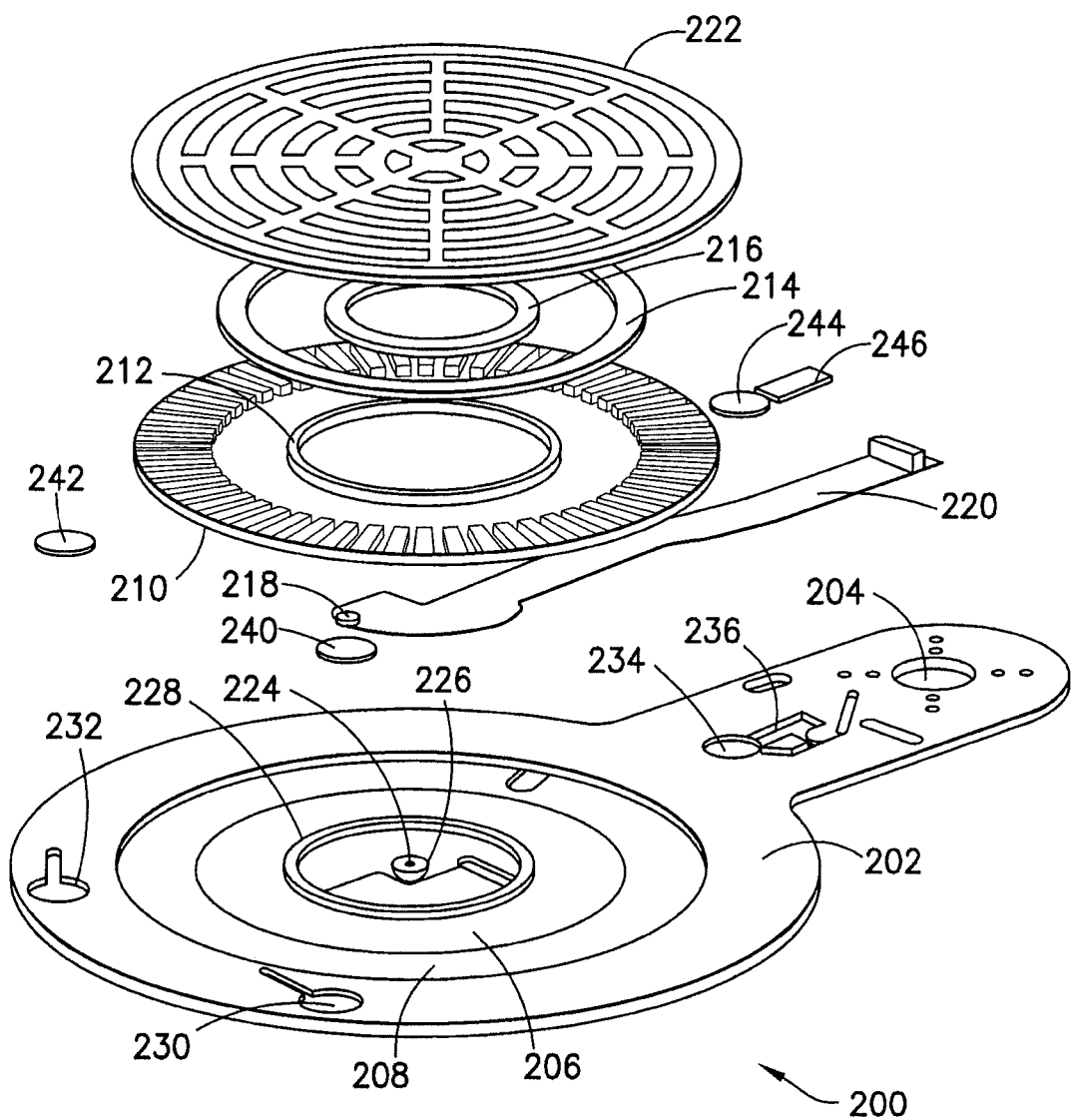
FIG. 7 illustrates a detailed view of an end-effector according to an embodiment of the present invention.

The end-effector, with its edge gripping mechanism, motor and sensors, must be sufficiently thin to fit between wafers stored in a stack. Typically, the distance between wafers in a stack is 10 mm of pitch and 0.77 mm of wafer thickness. FIG. 7 illustrates an embodiment of an end-effector 200 according to the present invention suitable for use with a stack of wafers with a small distance between the wafers. The end-effector 200 includes an end-effector base 202 that is connected to the robotic arm (not shown in this figure) at a connecting portion 204 thereof. The end-effector base 202 includes a first circular ledge 208 for receiving a motor stator 210 therein. The inner race 228 of the motor, such as a contact bearing, is seated on the end-effector base 202, that circularly extends up and around from the middle of the end-effector base 202. A motor rotor 214 and an encoder disk 216 are first disposed on the back surface of a wafer chuck 222. Then, the wafer chuck 222 with the motor rotor 214 and the encoder disk 216 together fit on the outer race of the contact bearing 212. After this fit, a gap between the encoder read head 218 and the encoder disk 216 is realized. Typically, the resulting gap is approximately 1 to 2 mm. An opening 224 at the center of the end-effector base 202 is connected to a vacuum channel (not shown). A ring seal 226 is disposed between the opening 224 of the end-effector base 202 and the bottom surface of the wafer chuck 222 for applying a vacuum across the top surface of the wafer chuck 222 to grip the wafers.

The end-effector base 202 further includes openings 230, 232, 234 and 236 for receiving sensors 240, 242, 244 and 246 that are positioned around the outer peripheral portion of the end-effector base 202. The openings 230, 232, 234 and 236 may be circular, rectangular, elliptical or other shapes and are dependent upon the designs of the sensors 240, 242, 244 and 246 that are being used for the sensing application. The sensors 240, 242, 244 and 246 may be capacitive, acoustical, optical, reflective or other known types of sensors for sensing applications such as determining the presence, absence and height of the wafer above the base, for example. To maximize the detection resolution, a plurality of sensors are positioned around the base and the surface area of each individual sensor is made as small as possible while still being large enough to detect edges and surfaces. Also, rectangular shaped sensors are preferred to detect wafer edges and circular shaped sensors to detect the distance of the wafer from the sensor in addition to edges and the notch of the wafer. However, it should be realized that different sensor shapes and sizes may be used depending upon the desired sensing application and resolution.

In the embodiment of FIG. 7, three circular sensors 240, 242 and 244 and one rectangular sensor 246 are positioned around the periphery of the end-effector base 202. Two of the circular sensors 240 and 242 are positioned towards the front the end-effector base 202 (typically the portion that first reaches the wafer) for first sensing wafer edges. The other circular sensor 244 and the rectangular sensor 246 are positioned near the periphery of the end-effector base 202 that connects to the robotic arm. Measurements from the rectangular sensor 246 and the two front sensors 240 and 242 are sent to the control processor and are used to center the wafer on the wafer chuck 222. Measurements from the three circular sensors 240, 242 and 244 are also used to align the planes of the wafer chuck 222 and the underside of the wafer. Once the wafer is centered and aligned, the vacuum is applied to the wafer chuck 222 and the wafer is gripped.

The robotic arm then moves the wafer to another station. While the robotic arm is moving, one of the three circular sensors—240, 242 and 244 is used to detect the notch. The three circular sensors 240, 242 and 244 are positioned so that the edge of the wafer passes substantially through the middle of each sensor. Once one of the sensors detects that the notch is directly over it, the control processor may then generate orienting signals to the end-effector 200 so that the notch is positioned at the desired orientations. This orientation is typically completed during the time that it takes for the wafer to reach the destination station.

The present system centers the wafer on the wafer gripping mechanism and positions the notch or flat in the desired orientation while moving the wafer from one station to a destination station without the need for a separate aligning or centering device. Because impacts between the wafer and the end-effector or the wafer and a cassette or stand generate particles that may damage the wafer, the present invention desirably minimizes picking up and placing of the wafers during the handling process. By eliminating an aligning device, at least one pick up and placing step is eliminated in the processing for each wafer. As a result, the wafer throughput is greatly improved since the alignment is done in parallel with the motion of the robotic arm, which reduces both processing time and equipment costs. For instance, if a cassette of 25 wafers is processed, a considerable amount of time can be saved in addition to improving the reliability of the system while drastically reducing particle generation to improve wafer yield.

Figure 8:
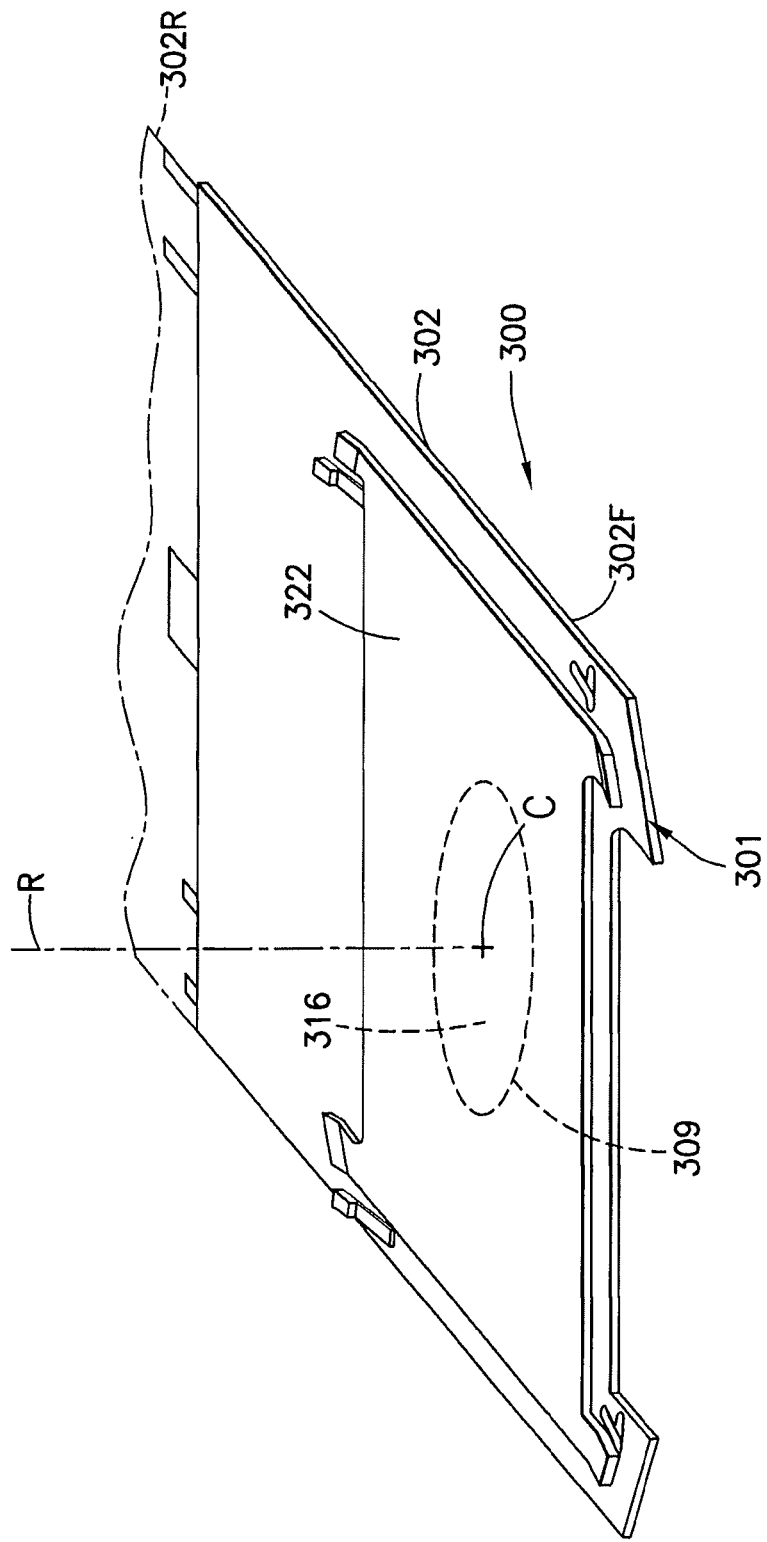
FIG. 8 is a perspective view of an end-effector according to another embodiment of the present invention.
Figure 10:
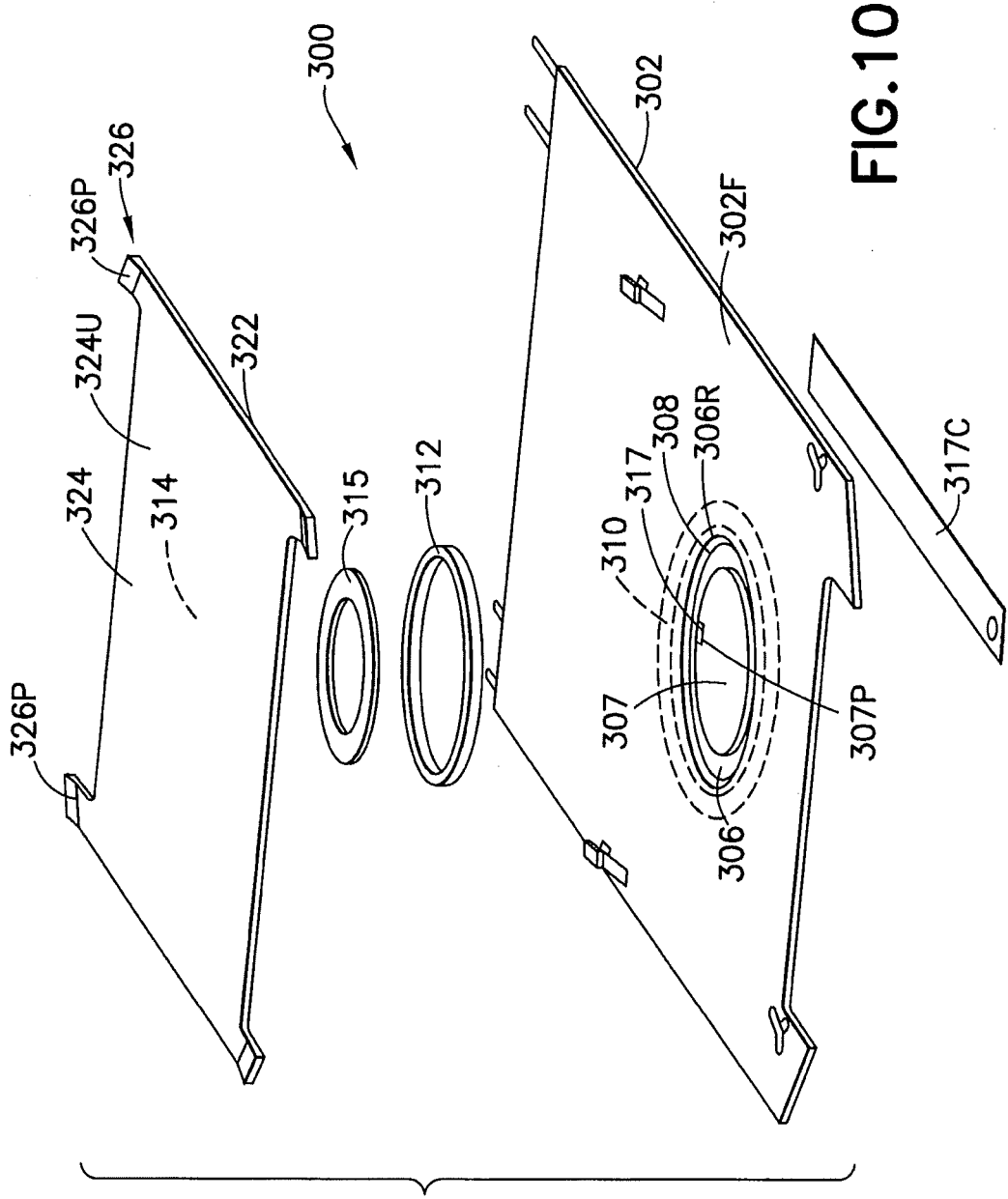
FIG. 10 is an exploded perspective view of the end effector in FIG. 8.

Referring now to FIG. 8 there is shown a perspective view of an end effector 300 in accordance with another exemplary embodiment of the present invention. End effector 300 is generally similar to the other end effectors 130, 200 described before and shown in FIGS. 2, 6 and 7. As with the other end effectors, end effector 300 can be mounted (at a joint similar to wrist joint 132) to the arm assembly 100 (See FIG. 2) in a substantially similar manner as end effectors 130, 200. Referring also to FIG. 10, which shows an exploded perspective view, the end effector 300 generally comprises a base 302, a chuck 322, and a motor 309. The base 302 is generally configured to allow the end effector to be mounted for example to the wrist joint 132 of the transfer arm 100 (see FIG. 2) as described above. The chuck 322 is movably supported from the base 302. The chuck 322 has structures for holding a substrate S (see for example FIG. 9) by edge gripping the substrate. As noted before, substrate S (similar to substrate 102 in FIG. 2) may be any suitable type of flat panel, such as a semiconductor wafer, a reticle, a flat panel display, and is shown as having a substantially circular outline for example purposes only. The motor 309 is also supported by the base 302 and is connected to the chuck to move the chuck 322 relative to the base. The motor 309 is located under the chuck and has an axis of motion R extending substantially through the center C of the substrate S when the substrate is held by the chuck 322. The motor 309 is a brushless motor integral to the base and chuck, and is controlled by controller 10 (see FIG. 1). The end effector 300 also includes a positional resolver 316 that is communicably connected to the controller 10. Sensors in the end effector, similar to the sensors in end effector 200, locate a fiducial on the substrate S from which the controller 10 finds the current orientation of the substrate and determines the desired orientation. The motor 309, under command from the controller 10, moves the chuck 322 until the desired orientation is achieved.

In greater detail now, and with reference also to FIGS. 9, 9A-9B which respectively show a plan view, a cross-sectional view through view line A-A, and an enlarged partial cross-sectional view of the end effector 300 and substrate S, the base 302 of the end effector generally comprises a rear section 302R (shown in phantom in FIG. 8), and a front section 302F. The rear section 302R has fixtures and attachments (not shown) possibly similar to base sections 130, 202 for mounting the base 302, and hence the end effector 300 to the arm. The front section 302F of the base 302 extends from the rear section 302R. The front section 302F in this embodiment forms the front 307 (i.e. the portion inserted to pick/place substrate S) of the end effector 300 (see FIG. 9). The front section 302F of the end effector may be a one-piece member (i.e. of unitary construction). In this embodiment, the front section 302F of the base is a printed circuit board (PCB). As seen in FIG. 9B, the PCB is self supporting and forms the structure of the front section 302F of the base. As can be realized from FIGS. 9 and 9A, the PCB forming the front section supports the chuck 322 of the end effector, and the substrate S held by the chuck. In alternate embodiments, the front and rear sections of the base may be included in a one-piece member PCB. In that case, a portion of the PCB itself may provide the attachments for mounting the end effector to the transport arm. In other alternate embodiments, the front section of the base may be an assembly that includes a PCB section supporting the chuck.

Figure 12:
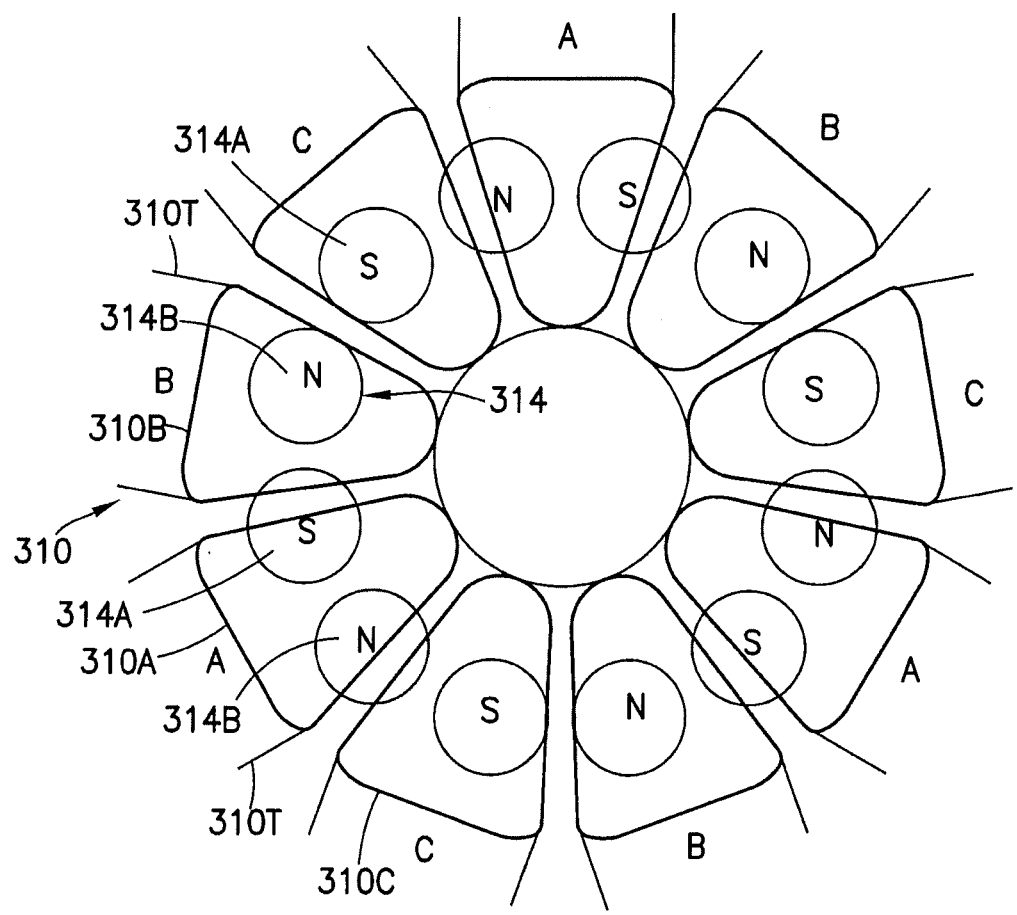
FIG. 12 is a plan view of a stator and rotor of a motor of the end effector shown in FIG. 8.

As can be realized from FIGS. 9 and 9B, the PCB forming the front section 302F (the front section will be referred to hereinafter as the PCB section of the base) is sized so that the stack height of the end effector 300 can be admitted between substrates having a 10.0 mm pitch. Accordingly, the board material of the PCB may have high stiffness to minimize undesired deflections of the base. The board material may be for example Alumina ceramic, carbon fiber composite, or any other suitable ceramic, composite, or plastic material having suitable insulating and mechanical properties to form the board of the PCB. As seen in FIG. 10, the stator 310 of motor 309 is formed in the PCB section 302F. In this embodiment, motor 309 is a rotary motor, though in alternate embodiments the end effector may incorporate a linear or planar motor in a manner substantially similar to that described below. As seen in FIG. 10, the stator 310 may have a generally circular configuration. The stator 310 may be formed integrally with the PCB section, by cladding the PCB during PCB fabrication as desired to define the windings of the stator. Any suitable cladding process may be used such as a lithographic process forming a desired number of layers on the PCB to generate the windings. The windings may be formed of any suitable conductive material such as copper, or tungsten. FIG. 12 shows a plan view of the stator windings 310A-310C formed integral to the PCB. The configuration of the windings 310A-310C shown in FIG. 12 is exemplary, and the windings may be formed to have any suitable configuration. The windings 310A-310C are disposed in the PCB to generate a magnetic field oriented axially across the stator. In alternate embodiments, the windings of the stator may be configured to generate a magnetic field having any other desired orientation. The stator windings are arranged in three phases 310A-310C as shown in FIG. 12, though in alternate embodiments the stator windings may have any suitable number of phases. In this embodiment, the stator is shown as having (for example purposes) nine winding coils (three for each phase) though any suitable size and number of winding coils may be used. The PCB section 302F may further have formed therein suitable conductive traces connecting the windings to a suitable power source (not shown) and to the controller 10 (see FIG. 1). The controller 10 controls the commutation of the stator windings 310A-310C as will be described further below to effect operation of the motor 309.

As seen best in FIGS. 9A-9B, and 12, the PCB section 302F has a recess 308 formed therein. The recess 308 in the PCB section 302F has a generally circular shape, and is substantially concentric with the integral stator 310 formed in the PCB section. The recess 308 provides support and coupling for the chuck 322 to the base 302 of the end effector. The recess 308 may have a deeper, substantially annular outer portion 306, and a more shallow inner portion 307. The outer portion 306 forms a radial seating surface 306R and a horizontal seating surface 306H. The radial surface 306R may be sized to form a close or press fit with the outer face of the very low profile bearing 312 used for rotatably coupling the chuck 322 to the base of the end effector. As noted before, the concentric configuration of the recess 308, and hence of radial surface 306R, with the stator results in the bearing 312 being concentric with stator 310 when the bearing is placed in recess 306. The horizontal seating surface 306H supports the bearings 312 when placed in the recess as shown in FIG. 9B. As can be realized, bearing 312 is capable of supporting both axial and radial loads. Suitable examples of ultra-thin bearings for use with this exemplary embodiment are available from Dynaroll Corp. (for example Dynaroll Application No. B4-72T12). In alternate embodiments, any other suitable bearing may be used to rotatably couple the chuck and base. In still other alternate embodiments, the chuck may be rotatably coupled to the base by any other suitable means such as for example magnetic coupling.

Still referring to FIG. 9B, the raised inner portion 307 (compared to outer channel 308) has a pocket 307P in this embodiment for mounting sensor 317 for the positional resolver 316 of the end effector. The PCB section 302F may include suitable conductive traces (not shown) formed integrally into the PCB for connecting the sensor 317 to the controller 10. Otherwise, conductors 317C may be connected to the sensor 317 and extend over a surface of the PCB section to connect the sensor to controller 10 as shown for example in FIG. 10 The PCB section 302F may include any other desired number of recesses or pockets (not shown) similar to openings 230, 232, 234, 236 in FIG. 7 for receiving sensors similar to sensors 240, 242, 244, and 246 that are positioned around the peripheral portion of the end-effector base for sensing the position and orientation of the substrate.

Referring now to FIGS. 9, 9A-9B and 10, the chuck 322 may include a structure member 324, as well as the motor rotor 314 and a portion of the positional resolver 316, connected together as a one-piece assembly as will be described further below. The chuck structure member 324 may be a one-piece member or may be an assembly as desired to reduce weight of the end effector as well as weight on the PCB section 312F. The chuck structure member 324 may be made from stiff light weight materials such as composites. The structure member 324 may be substantially flat as shown or may have any other suitable configuration. The upper surface 324U has a suitable substrate support structure 326. The support structure 326 is configured to effect edge-gripping of the substrate S. In this embodiment, as may be realized from the description herein, the chuck structure member 324 is configured as a passive grip chuck and the support structure 326 comprises pads 326P (four are shown for example purposes) raised from the upper surface 324U. The pads 326P are arranged to contact the perimeter edge of the substrate and passively grip the substrate (see FIG. 9). When the substrate is picked with the end effector, the substrate is seated on the pads 326P and a gap is formed as shown in FIG. 9B between the substrate S and upper surface 324U of the chuck. In alternate embodiments, one or more pads may be provided that are movable (such as by pneumatic or electro-magnetic means) to engage the edge of the substrate and grip the substrate between the pads. In this embodiment, the PCB section 302F may be provided with a vacuum source (not shown) similar to vacuum port 224 and seal ring 226 (see FIG. 7) for securing the substrate S to the chuck.

As noted before, the chuck 322 holds the motor rotor 314 as well as a portion of the positional resolver. As shown in FIG. 9B, the lower surface of the chuck support member 324 has a number of pockets or recesses 328, 330, 332 formed therein. The recesses are also indicated by dashed lines in FIG. 9. Recess 328 is sized to receive the permanent magnets 314A, 314B forming the motor rotor 314. Referring again to FIG. 12, the rotor 314 in this embodiment may be formed from a set of permanent magnets 314A, 314B arranged with alternating polarity as shown. The magnets may have any suitable shape (and are shown as having a circular shape for example purposes only). As can be understood from FIGS. 9B and 12, the recesses 328 receiving magnets 314A, 314B are shaped to conform to the magnets. The magnets may be mounted or bonded in the recesses with any suitable potting compound, adhesive, or any other suitable means. In alternate embodiments, the rotor magnets may be attached to the lower surface of the chuck without nesting in pockets or recesses. As seen in FIG. 12, the rotor magnets 314A, 314B are arranged to operably cooperate with the stator windings 310A-310C in the PCB section 302F when the chuck is mounted on the base. Further, the magnets are so arranged that the axis of rotation R of the motor 309 extends substantially through the center C of the substrate S when seated on support structure 326 of the chuck (see FIG. 8).

As noted before, in this embodiment the chuck 322 is positionally coupled to the base by bearing 312. Recess 332 in the lower surface of the chuck (see FIG. 9B) is sized to conformally receive the bearing 312. Correspondingly, recess 332 may have an annular shape, forming an inner radial bearing surface 332R and a horizontal seating surface 332H. As seen in FIG. 9B, when received in recess 332, the bearing 312 bears with the inner face against radial surface 332R and is seated on the upper face on seating surface 332H. Thus, bearing 312 provides the positional alignment between the motor rotor 314 in the chuck 322 and the motor stator 310 integral to the PCB section of the base 302 of the end effector. As seen best in FIG. 9B, bearing 312 maintains a clearance gap between chuck 322 and PCB section 302F when the two are coupled. In the embodiment shown in FIG. 9B, the recess 330 of the chuck receives the positional encoder 315 of the positional resolver 316 (see also FIG. 8). As can be realized, motor 309 in this embodiment is rotary, and hence the positional resolver may be a rotary resolver using an encoder ring. In embodiments where the motor is linear or planar, a linear or planar resolver may be used. The resolver 316 may be any suitable type of resolver, such as an optical resolver or electromagnetic resolver. In the case of an optical resolver, the sensor 317 in the base, may be any suitable optical sensor (e.g. Photo cell, CCD, laser). The encoder ring 315 may have any suitable optically readable indicia. In the case of an electromagnetic resolver, the sensor may be a capacitive sensor, and the encoder may have magnetic indicia/features so that the output from the capacitive sensor provides indications of the position/orientation of the chuck relative to the base. In other alternate embodiments, the sensor of the resolver may be integrated into the windings of the stator so that positional resolution of the rotor may be provided to the controller by stator feedback. The controller 10 uses the information from the rotary resolver for commutating the windings of the motor 309 to effect motion of the chuck 322, and hence the substrate S on the chuck, relative to the base.

Figure 11:
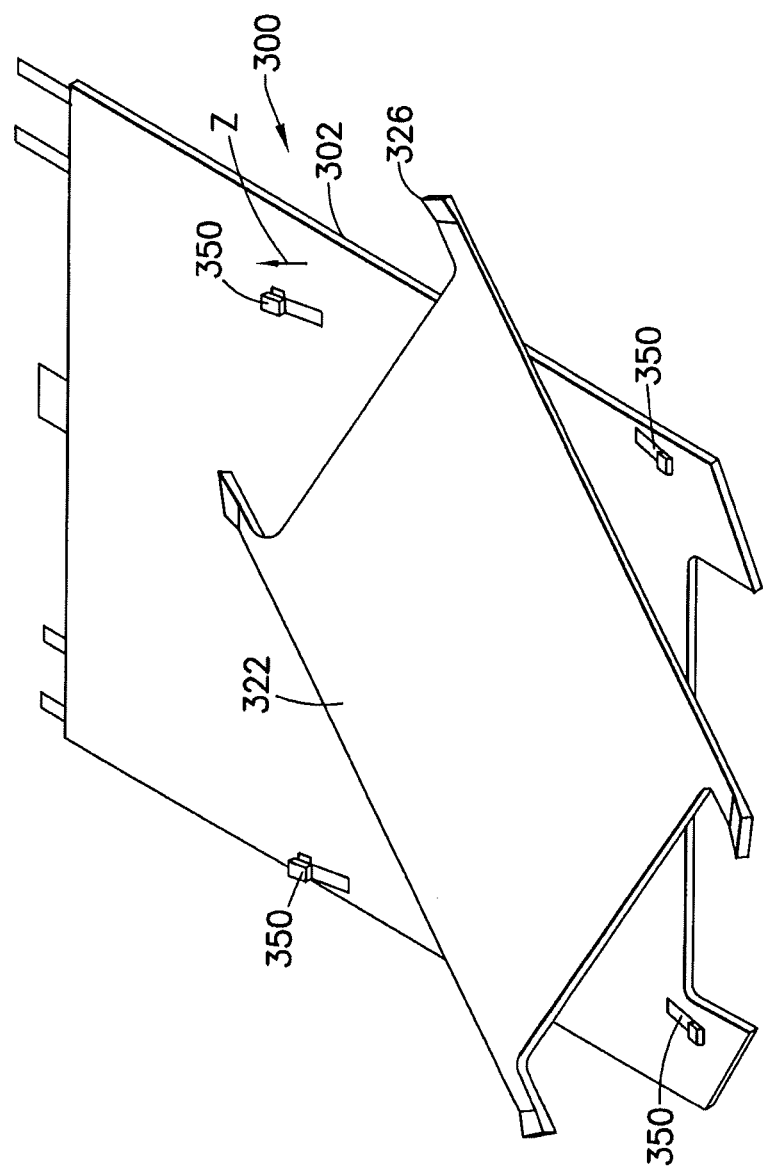
FIG. 11 is another perspective view of the end effector in FIG. 8 with the chuck of the end effector rotated to a different position from that shown in FIG. 8.

Motor 309 may be controlled by controller 10 to orient the substrate S "on the fly" in a manner substantially similar to that described before with reference to the embodiment shown in FIG. 7. For example, after picking a substrate S, the controller may operate motor 309 to rotate the chuck in a desired direction (e.g. clockwise or counter-clockwise about axis R) until the fiducial (notch, see FIG. 5) on the substrate is detected by a sensor (similar to sensors 240, 242, 244 in FIG. 7). The controller may use information from the sensor to generate orienting signals for motor 309. This causes the end effector to rotate about axis R (see FIG. 8) until the substrate S is in a desired position relative to the end effector. In this position, however, the chuck 322 of the end effector may be out of true with the sides of the end effector base 302. The chuck 322 is shown in this out of true position in FIG. 11. The base may be provided with suitable elevatable supports 350, if desired to allow resetting the chuck 322 while maintaining the substrate orientation. Thus, the end effector is configured to re-orient the chuck 322 relative to the base of the end effector independent of an orientation of the substrate held on the end effector. The elevatable supports may be of any suitable type, including for example, piezo-electric, pneumatically actuated or any others. In FIG. 11, four elevatable supports 350 are shown for example purposes only. The supports 350 are located on the base 302 of the end effector to contact the perimeter edge of the substrate S. As can be seen in FIG. 11, the supports may be raised or elevated from the upper surface of the base 302 (in the direction indicated by arrow Z in FIG. 11) to lift the substrate from support structure 326 of the chuck. The substrate is seated on raised supports 350 while the chuck is reset using motor 309 to a true position (see FIG. 8). The supports 350 may then be lowered to place the substrate S again on the chuck supports 326. The orientation of the substrate S is thus maintained while the chuck position is reset.

The end effector 300 in accordance with this exemplary embodiment provides numerous advantages over conventional systems. Incorporating, by way of example, the motor stator windings into the end effector base, which is a PCB of unitary construction, reduces overall weight of the end effector as well as minimizing profile height. In addition, the base is provided with higher stiffness by avoiding large cutouts in the base structure for inserting the motor. Further advantages, for example further reduction in end effector profile, are achieved by placement of the rotor in the chuck. The "on-axis" position of the motor eliminates use of a transmission thereby further eliminating weight, complexity, and cost compared to conventional systems.

It will be apparent to those skilled in the art that other modifications to and variations of the above-described techniques are possible without departing from the inventive concepts disclosed herein. Accordingly, the invention should be viewed as limited solely by the scope and spirit of the appended claims.

What is claimed is:

1. A semiconductor substrate transport apparatus comprising:
   a movable transport arm; and
   an end effector movably connected to the transport arm, the end effector having a rotatable passive grip chuck including fixed substrate edge grip supports adapted for passively holding a semiconductor substrate when rotated by the rotatable passive grip chuck, and a motor for moving the substrate held by the chuck, wherein the motor is disposed relative to the chuck so that, when the substrate is held by the chuck, a center of the substrate is substantially co-incident with an axis of movement of the motor.

2. The apparatus according to claim 1, wherein the end effector has at least one sensor thereon to sense an predetermined characteristic of the substrate.

3. The apparatus according to claim 2, wherein the predetermined characteristic is at least one of an edge of the substrate or a fiducial feature of the substrate.

4. The apparatus according to claim 2, further comprising a controller in communication with the at least one sensor and the motor, and wherein the controller is programmed to actuate the motor for moving the substrate based on information from the at least one sensor.

5. The apparatus according to claim 4, wherein the controller is configured to move the substrate with the motor substantially simultaneously with the transport arm moving the substrate from one station to another station.

6. The apparatus according to claim 1, wherein the end effector has a support member supporting the chuck, the chuck being rotatably mounted relative to the support member to rotate relative to the support member, and wherein the axis of movement is an axis of rotation of the motor.

7. The apparatus according to claim 1, wherein the motor is a brushless motor and is located on a support member of the end effector supporting the chuck, the brushless motor being located on the support member at a location under the chuck.

8. The apparatus according to claim 7, further comprising a positional resolver connected to the chuck for providing position information of the chuck to a controller operating the motor.

9. The apparatus according to claim 1, wherein the motor comprises a stator and a rotor, the stator being integral to a base of the end effector, and the rotor being integral to the chucks.

10. A vacuum substrate processing system comprising the apparatus according to claim 1.

11. The apparatus according to claim 1, wherein the end effector is configured to re-orient the chuck relative to a base of the end effector independent of an orientation of the semiconductor substrate held on the end effector.

12. A semiconductor substrate transport apparatus comprising:
   a movable transport arm;
   an end effector movably connected to the transport arm, the end effector having a base section mounting the end effector to the transport arm, and a chuck movably mounted to the base section and adapted for holding a substrate; and
   a motor connected to the end effector for moving the substrate held by the chuck, wherein the motor is integral with the end effector, at least a drive part of the motor being of unitary construction with the base section of the end effector and at least a reaction part of the motor being mounted to the chuck.

13. The apparatus according to claim 12, wherein the drive part is a stator and the reaction part is a rotor, and wherein the stator is disposed on the base section and the rotor on the chuck so that, when the substrate is held by the chuck, a center of the substrate is substantially co-incident with an axis of rotation of the motor.

14. The apparatus according to claim 12, wherein the motor is a brushless motor.

15. An end effector motor for an end effector of a substrate transport apparatus, the end effector having a cantilevered support member and a chuck movably mounted to the cantilevered support member and adapted for holding a substrate thereon, the motor comprising:
   a stator sized and shaped for being a cladding in the cantilevered support member of the end effector; and
   a rotor operably interfacing with the stator and adapted to be mounted to the chuck of the end effector.

16. The motor according to claim 15, wherein the rotor comprises at least one permanent magnet.

17. The motor according to claim 15, further comprising a rotary resolver connected to the rotor, and a controller communicably connected with the rotary resolver and the stator for commutating windings of the stator.

18. A semiconductor substrate transport apparatus comprising:
   a movable transport arm; and
   an end effector movably connected to the transport arm, the end effector comprising a support member mounting the end effector to the transport arm, a chuck movably mounted to the support member and adapted for holding a substrate, and a motor for moving the substrate held by the chuck, wherein the support member has a portion of unitary construction that defines a stator of the motor.

19. The apparatus according to claim 18, wherein the chuck is mounted to the portion of unitary construction of the support member.

20. The apparatus according to claim 18, wherein the portion of unitary construction extends under the chuck.

21. The apparatus according to claim 18, wherein the motor comprises a rotor, the rotor being mounted to the chuck.

22. The apparatus according to claim 21, wherein the rotor comprises permanent magnets.

23. The apparatus according to claim 18, wherein the motor is a brushless motor.

* * * * *